(12) United States Patent
Lin (10) Patent No.: US 6,562,673 B2
(45) Date of Patent: May 13, 2003

(54) METHOD OF FABRICATING A SELF-ALIGNED SPLIT GATE FLASH MEMORY CELL

(75) Inventor: Chi-Hui Lin, Taipei (TW)

(73) Assignee: Nanya Technology Corporation, Taoyuan (TW)

(*) Notice: Subject to any disclaimer, the term of this patent is extended or adjusted under 35 U.S.C. 154(b) by 36 days.

(21) Appl. No.: 09/948,530

(22) Filed: Sep. 7, 2001

(65) Prior Publication Data

US 2002/0142545 A1 Oct. 3, 2002

(30) Foreign Application Priority Data

Mar. 28, 2001 (TW) .................................. 90107305 A (51) Int. Cl.[7] .................... H01L 21/8238; H01L 21/336
(52) U.S. Cl. ...................... 438/211; 438/257; 438/267; 257/316
(58) Field of Search ........................... 438/257–267, 438/593, FOR 203, FOR 212, FOR 265, 201, 211; 257/239, 261, 314–322

(56) References Cited

U.S. PATENT DOCUMENTS 6,180,461 B1 * 1/2001 Ogura ........................ 438/266
6,482,700 B2 * 11/2002 Chen et al. .................. 438/267

* cited by examiner

Primary Examiner—Matthew Smith
Assistant Examiner—Calvin Lee
(74) Attorney, Agent, or Firm—Ladas & Parry (57) ABSTRACT

A method of fabricating a memory cell of self-aligned split gate flash memory first provides a substrate having an active area. A first gate insulating layer, a conductive layer and a buffer layer are formed within the active area. A portion of the buffer layer is removed to form a first opening. A buffer spacer is formed on the side walls of the first opening. A portion of the conductive layer and first gate insulating layer under the first opening are removed to form a second opening. The contact spacers, the source region and the contact plug are formed in the second opening in sequence. After the buffer spacers are removed, a third opening is formed. The bottom surface of the third opening and the top surface of the contact plug are oxidized to form the oxide layers. Another buffer spacers fill the third opening. The remaining buffer layer is removed to form the fourth opening. The conductive layer under the bottom of the fourth opening is removed, except the portion under the oxide layer, to form the floating gates. After the formation of a second gate insulating layer, the control gates and the control gate spacers are formed in sequence.

30 Claims, 8 Drawing Sheets

METHOD OF FABRICATING A SELF-ALIGNED SPLIT GATE FLASH MEMORY CELL

BACKGROUND OF THE INVENTION

1. Field of the Invention

The present invention relates to a method of fabricating flash memory, and more particularly to the fabrication of a self-aligned split gate memory cell of the flash memory.

2. Description of the Prior Art

Complementary metal-oxide-semiconductor (CMOS) memory can be divided into two main categories: random access memory (RAM) and read-only memory (ROM). ROM's market share has been continuously growing in the past few years, and further growth in the near future is foreseen, especially for flash memory in which a single cell can be electrically programmable and a block, sector or page of cells are electrically erasable at the same time. Due to the flexibility of flash memory against electrically programmable read-only memory (EPROM), electrically programmable but erasable via ultraviolet exposure, the market share of flash memory has been continuously growing in the past few years, and further growth in the near future is foreseen. Electrically erasable and programmable read-only memory (EEPROM), electrically erasable and programmable per single byte, will be manufactured for specific applications only, since they use larger area and are more expensive. In recent years, flash memory has found interesting applications in electrical consumer products such as: digital cameras, digital video cameras, cellular phones, laptop computers, mobile MP3 players, and Personal Digital Assistants (PDA's). Since portability of these electrical consumer products is strongly prioritized by consumers, the products' size must be minimal. As a result, the capacity of the flash memory must be enlarged, and functions have to be maximized while size is reduced. The capacity of flash memory has increased from 4 to 256 MB, and even 1 GB in the near future. With the increase in packing density for flash memory, floating gates and control gates have to be made as small as possible. In conventional processes, masks are usually used to define the gates in flash memory. FIGS. 1A to 1F show the manufacturing processes of a conventional split gate flash memory device.

Figure 1A:
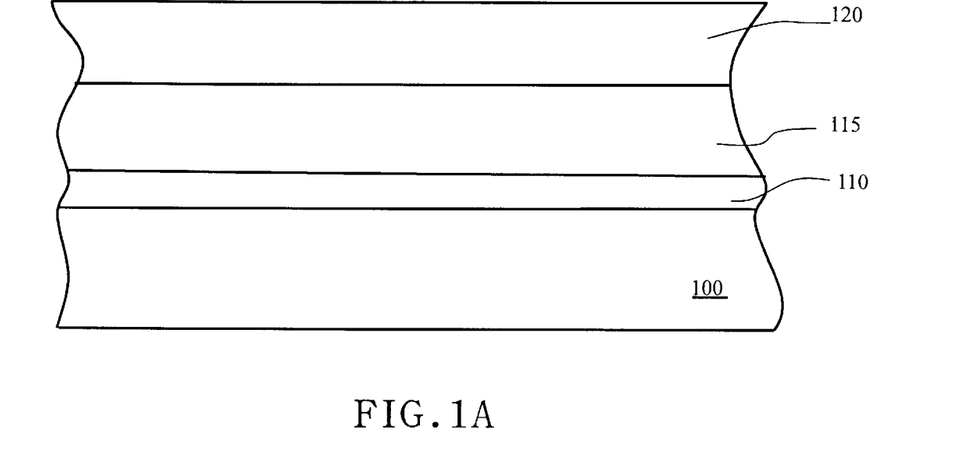
FIGS. 1A through 1F show schematic cross-sectional views of a partially fabricated integrated circuit structure at successive stages in forming a memory cell of a self-aligned split gate flash memory of the prior art.

Referring to FIG. 1A, a semiconductor substrate 100 is provided, using an LOCOS Oxidation process to form a field insulating layer (not shown) on the substrate 100. The field insulating layer isolates each Active Area. Then, an ordinary semiconductor process is used to form an oxide layer as the first gate insulating layer 110. A conductive layer 115 is formed on the first gate insulating layer 110. The conductive layer 115 is a doped polycrystalline silicon layer formed by CVD process. Then, a first masking layer 120 is formed on the first conductive layer 115 by depositing a silicon nitride layer.

Figure 1B:
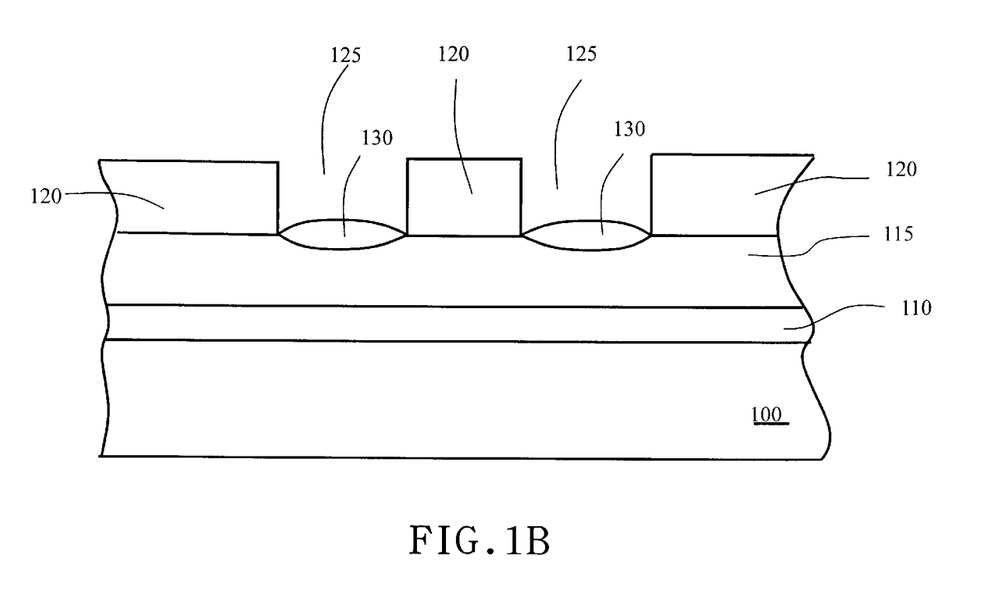

Referring to FIG. 1B, the first masking layer 120 is removed by performing an etching process to define the first opening 125 and to expose the surface of the first conductive layer 115. Then, an oxide layer 130 is formed on the exposed surface of the first conductive layer 115 by an oxidation process.

Figure 1C:
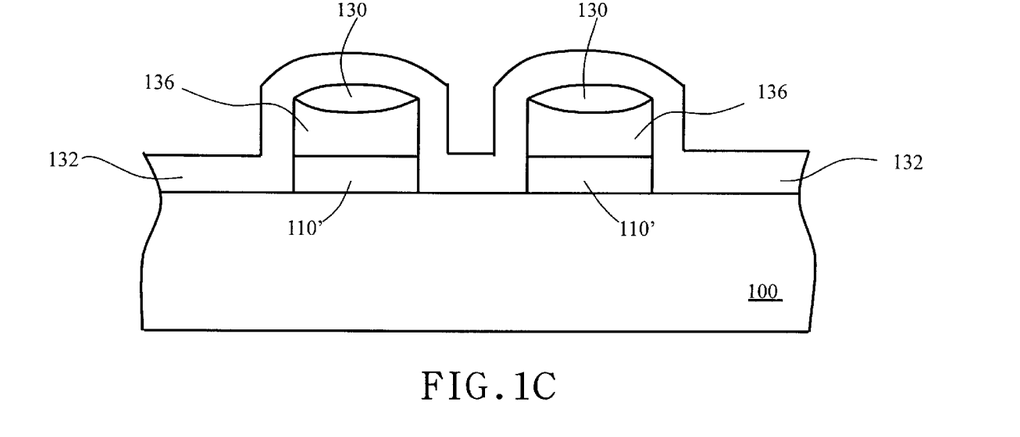

Referring to FIG. 1C, after removing the first masking layer 120 by isotropic etching using oxide layer 130 as the hard mask, a portion of the first conductive layer 115 and the first gate insulating layer 110 are sequentially removed to expose the surface of the substrate 200 by anisotropic etching. The portions of the first conductive layer 115 and the first gate insulating layer 110 under the oxide layer 130 remain. The remaining first conductive layer 115 forms the floating gate 136. The remaining first gate insulating layer 110 will be expressed as the remaining first gate oxide layer 110'. A second gate insulating layer 132 is formed on the surface of the substrate 100, the oxide layer 130, the floating gate 136 and the remaining first gate oxide layer 110'. The second gate insulating layer 132 is the oxide silicon and is formed by oxidation or CVD.

Figure 1D:
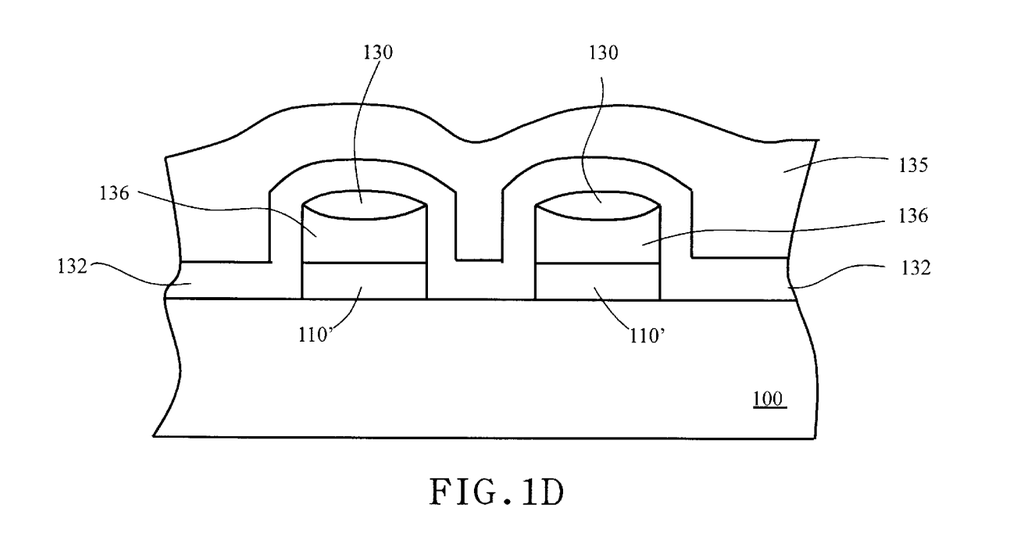

In FIG. 1D, a second conductive layer 135 is formed by oxidation. The second gate insulating layer 132 is then covered by the second conductive layer 135.

Figure 1E:
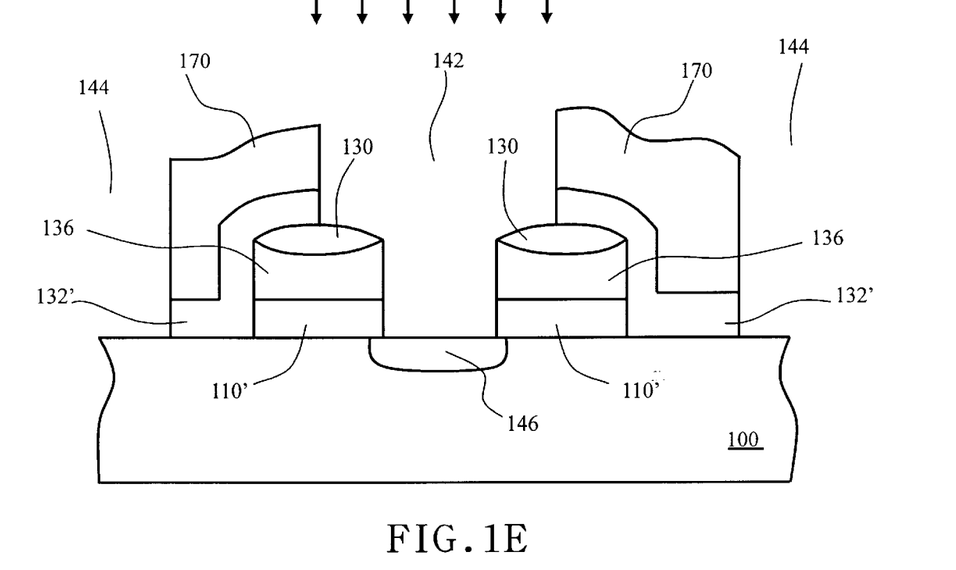

In FIG. 1E, using photolithography and etching, a first opening 142 and a second opening 144 are formed by removing portions of the second conductive layer 135 and the second gate insulating layer 132. The remaining second conductive layer 135 is the control gate 170. The remaining second gate insulating layer 132 will be expressed as the remaining second gate insulating layer 132' thereinafter. A layer of photoresist fills up the first opening 142 and the second opening 144, the photoresist in the first opening 142 is then removed. The source region 146 is formed on the exposed substrate 100 by implanting N-type ions, such as Phosphorus or Arsenic into the substrate 100, which is exposed in the first opening 142.

Figure 1F:
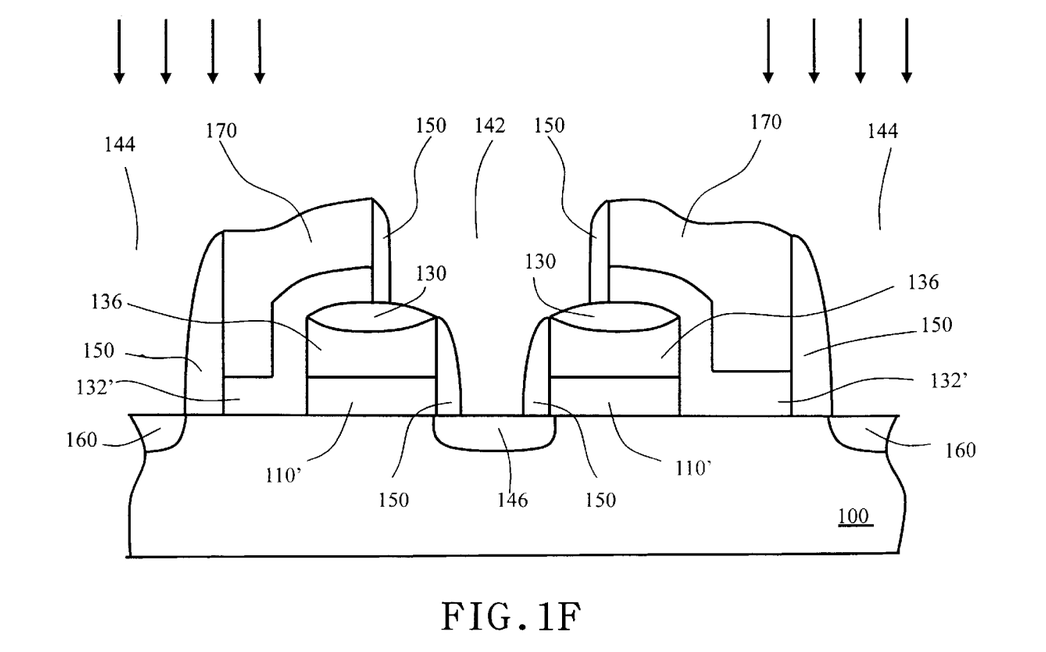

In FIG. 1F, an oxide layer (not shown) is formed to cover the surface and the side walls of the control gate 170, the surface of the oxide layer 130, and the side walls of the remaining second gate insulating layer 132', floating gate 136, the remaining first gate insulating layer 110'. Etching is performed to remove portions of the oxide layer and form the side wall spacer 150 on the side walls of the floating gate 136, the remaining first gate insulating layer 110', the control gate 170 and the remaining second gate insulating layer 132'. A layer of photoresist fills the first opening 142 and the second opening 144, and the photoresist in the second opening 144 is then removed. The drain region 160 is formed on the exposed substrate 100 by implanting N-type ions, such as Phosphorus or Arsenic into the substrate 100, which is exposed in the second opening 144. The manufacture of a cell of flash memory is thus completed.

The conventional processes for fabricating flash memory usually use photo masks to define the split gates. As memory devices have become highly integrated, the line width of flash memory has been reduced to under 0.08 μm or less. The precision of photo masks and photolithography equipment, such as the stepper, have been limited. The misalignment caused by photo masks is difficult to detect. Misalignment easily causes open circuits or short circuits of flash memory device. The electrical character of flash memory then fails and data access error easily occurs. The manufacture of flash memory includes hundreds of process steps and takes weeks or even months. While misalignment happens during photolithography, it is difficult to detect during manufacture due to the limitations of photolithography equipment. Usually, the electrical characteristic tests of flash memory are performed at the end of the manufacturing processes. When the electrical characteristic tests fail at the final tests, many product wafers have to be scrapped. Yield is compromised.

SUMMARY OF THE INVENTION

Accordingly, the primary object of the present invention is to provide a method of fabricating a split gate memory cell of flash memory by self-aligned processes instead of photo masks.

It is the object of the present invention to provide a method of fabricating self-aligned split gate memory cells to reduce the size of the floating gates and control gates of flash memory.

Another object of the present invention is to provide a method of fabricating split gate memory cells of flash memory by self-aligned processes to prevent short circuit or open circuit caused by misalignment of the photo masks in photolithography.

A method of fabricating a self-aligned split gate flash memory cell first provides a substrate. Defining an active area on the substrate, a first gate insulating layer is formed within the active area. A first conductive layer is formed on the first gate insulating layer. Then, a first buffer layer is formed on the first conductive layer. A first opening is formed by removing a portion of the first buffer layer. Afterwards, first buffer spacers are formed on the side walls of the first opening. Using the first buffering layer and the first buffer spacers as a mask to remove a portion of the first conductive layer and a portion of the first gate insulating layer under the first opening, then, a second opening is formed. Contact spacers are formed on the side walls of the second opening. A source region is formed on the substrate within the second opening. A contact plug is then formed in the second opening. First buffer spacers are removed to form a third opening and expose portions of the substrate. An oxide layer is formed on the surface of the first conductive layer at the bottom of said third opening and on the top surface of the contact plug uncovered by the contact spacers. Second buffer spacers are formed in the third opening and the first buffer layer is removed to form a fourth opening. Portions of the first conductive layer and the first gate insulating layer uncovered by the oxide layer at the bottom of the fourth opening form floating gates. A second gate insulating layer is formed. Control gates are formed on the side walls of the fourth opening. Control gate spacers are formed on the side walls of the control gates, and drain regions are formed on the substrate within the fourth opening.

BRIEF DESCRIPTION OF THE DRAWINGS

The accompanying drawings forming a material part of this description, in which.

DETAILED DESCRIPTION OF THE PREFERRED EMBODIMENT

The invention disclosed herein is directed to a method of fabricating the memory cell of flash Memory. The drawing illustrates a partially completed integrated circuit device. In the following description, details are set forth in order to provide a thorough understanding of the present invention. It will be appreciated by those skilled in the art that variations of these specific details are possible while still achieving the results of the present invention. Well-known process steps are not described in detail in order to avoid unnecessarily obscuring the present invention.

Figure 2A:
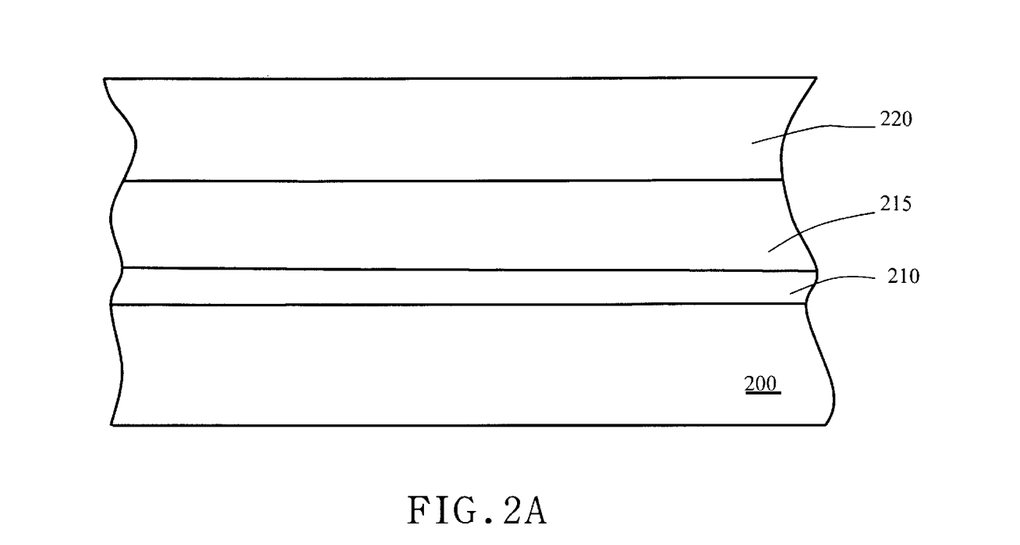
FIGS. 2A through 2I show schematic cross-sectional views of a partially fabricated integrated circuit structure at successive stages in forming a memory cell of a self-aligned split gate flash memory according to an embodiment of the present invention.

As shown in FIG. 2A, a semiconductor substrate 200, for example, a p-type silicon substrate, is provided. By using LOCOS or STI technique, a field insulating layer (not shown) is formed to define the active area (not shown) on the substrate 200. A first gate insulating layer 210 is formed on the substrate 200 within the active area. The first gate insulating layer 210 can be made of oxide formed by oxidation and has a thickness of from 50 to 200 angstroms. Then, a first conductive layer 215, which has a thickness of about 1000 to 2000 angstroms, is formed on the first gate insulating layer 210. The first conductive layer 215 is usually made of doped polycrystalline silicon formed by CVD. The first conductive layer 215 can be doped by Phosphorus ions or Arsenic ions by diffusion, implantation or in-situ doping. A first buffer layer 220, with a thickness of about 1000 to 2000 angstroms, is formed on the first conductive layer 215. The first buffer layer 220 can be made of nitride and is formed by LPCVD technique.

Figure 2B:
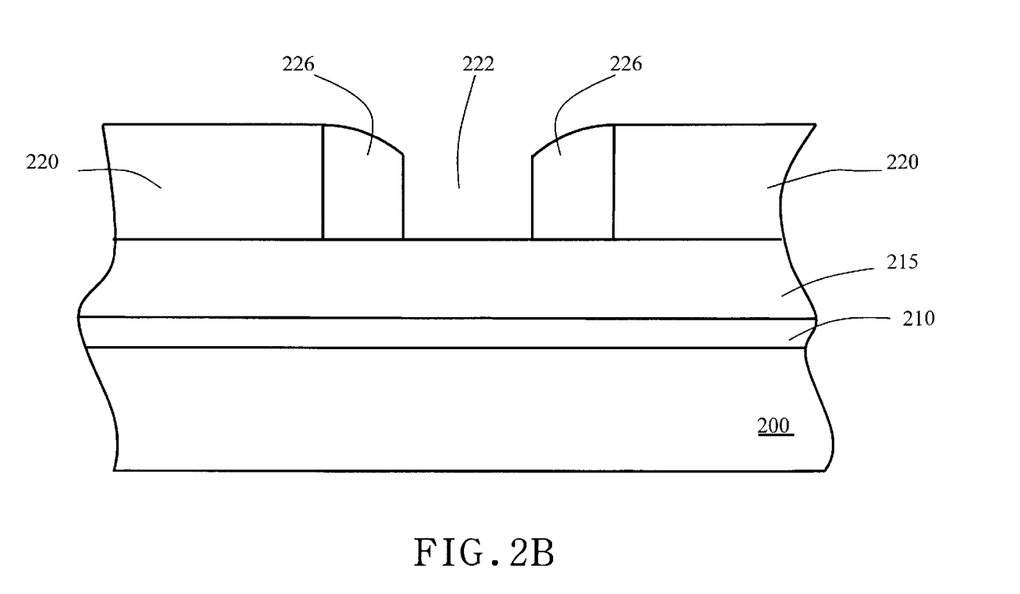

As shown in FIG. 2B, a first buffer layer 220 is defined by photolithography and etching. Afterwards, a portion of the first buffer layer 220 is removed to form a first opening 222. An insulating layer (not shown), with a thickness of about 500 to 2000 angstroms, is formed on the first buffer layer 220 and extends to cover the side walls and bottom of the first opening 222. The insulating layer can be made of oxide, formed by LPCVD. Then, anisotropic etching is performed, and the insulating layer on the surface of the first buffer layer 220 and on the bottom of the first opening 222 removed to form a first buffer spacer 226, the portion remaining on the side walls of the first opening 222 forming the first buffer spacer 226.

Figure 2C:
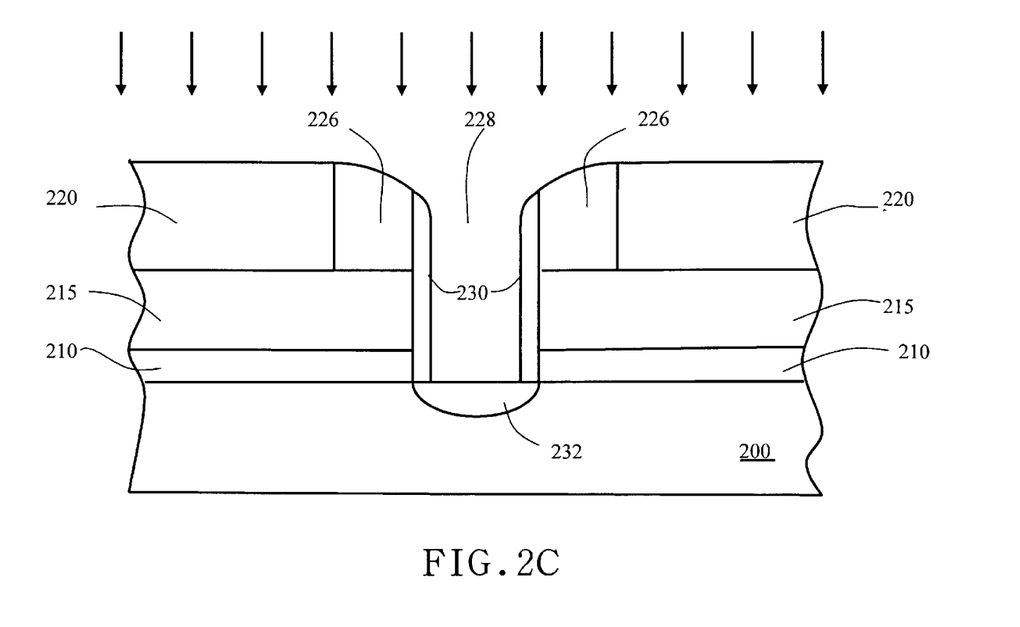

As shown in FIG. 2C, using the first buffer layer 220 and the first buffer spacers 226 as the mask, the first conductive layer 215 and the first gate insulating layer 210 under the first opening 222 is removed to form a second opening 228 by etching, such as anisotropic etching. The second opening 228 includes the first opening 222 and is deeper than the first opening 222. After forming the second opening 228, another insulating layer (not shown), which has a thickness of about 100 to 300 angstroms, is formed to cover the surface of the first buffer layer 220 and the first buffer spacers 226 and extends into the second opening 228 to cover the side walls and bottom of the second opening 228. The insulating layer can be made of a nitride formed by LPCVD. Anisotropic etching is performed to remove the insulating layer on the first buffer layer 220 and the first buffer spacers 226, and on the bottom of the second opening 228, the portion on the side walls of the second opening 228 remaining to form contact spacers 230. The N-type impurity ions are then implanted through the second opening 228 into the substrate 200 to form the source region 232.

Figure 2D:
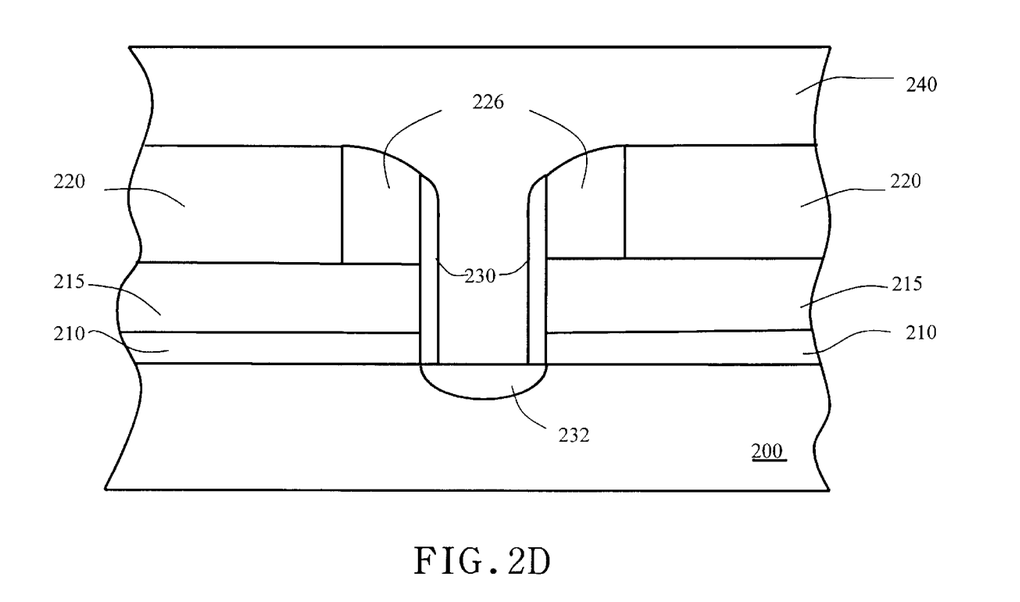

As shown in FIG. 2D, a second conductive layer 240 is formed on the first buffer layer 220 and the first buffer spacers 226, and fills up the second opening 228. The second conductive layer 240 has a thickness of about 1000 to 3000 angstroms and is usually made of the doped polycrystalline silicon formed by LPCVD. The second conductive layer 240 can be doped by the Phosphorus ions or Arsenic ions by diffusion, implantation or in-situ doping.

Figure 2E:
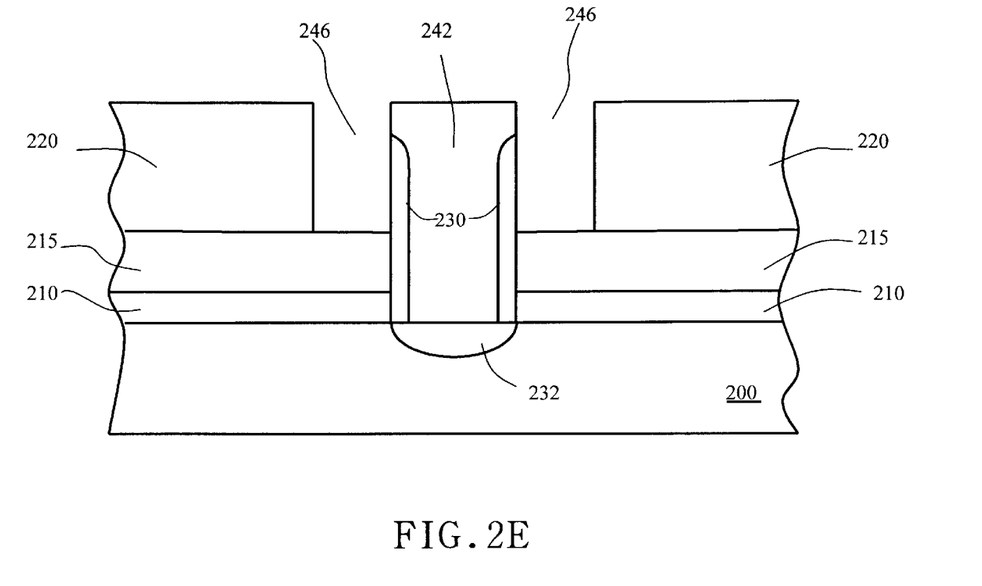

As shown in FIG. 2E, the second conductive layer 240 on both of the first buffer layer 220 and the first buffer spacers 226 is removed by planarization, such as the chemical mechanical polishing (CMP). The residual second conductive layer 240, which remains in the second opening 228, forms the contact plug 242. Then, the first buffer spacers 226 are removed by etching, such as isotropic etching, to form the third opening 246 and a portion of the surface of the first conductive layer 215 is exposed.

Figure 2F:
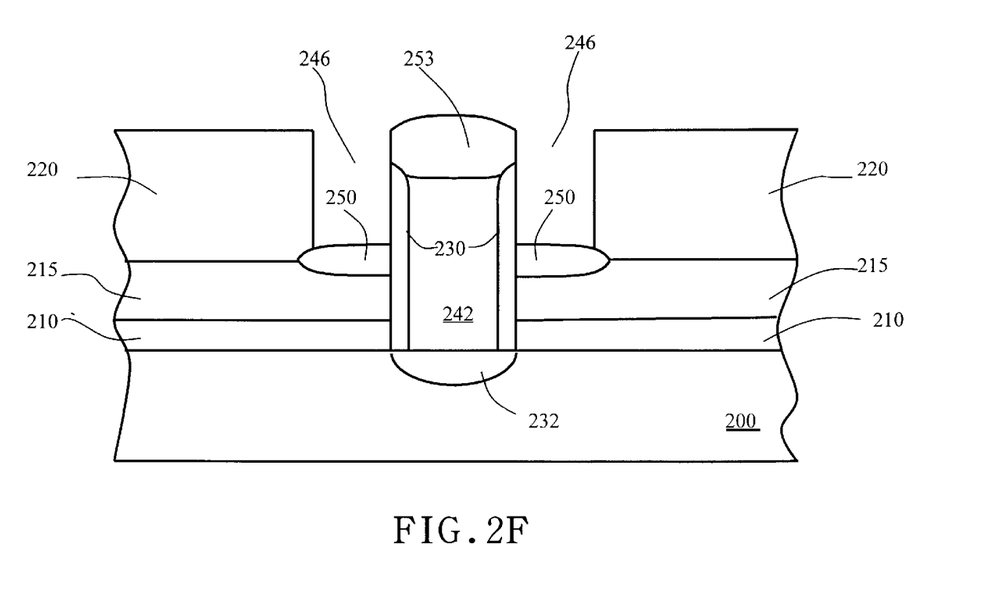

As shown in FIG. 2F, oxidation is performed, and the first conductive layer 215 at the bottom of the third opening 246 is oxidized to form the first oxide layer 250, and the top surface of the contact plug 242 uncovered by the contact spacers 230 is oxidized to form the second oxide layer 253.

Figure 2G:
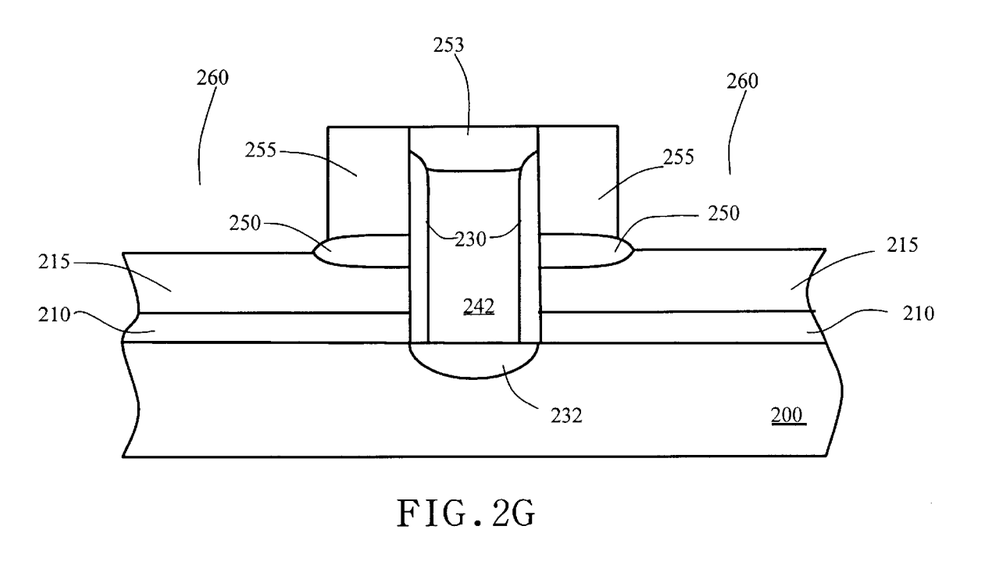

As shown in FIG. 2G, a second buffer layer (not shown) is formed on the first buffer layer 220 and contact plug 242, and fills up the third opening 246. The second buffer layer, which has a thickness of about 500 to 2000 angstroms, is made of a silicon oxide formed by LPCVD. The second buffer layer on both the first buffer layer 220 and the contact plug 242 is removed by planarization, such as CMP. The portion of the second buffer layer remaining in the third opening 246 forms the second buffer spacers 255. Then, the first buffer layer 220 is removed by etching to form a fourth opening 260.

Figure 2H:
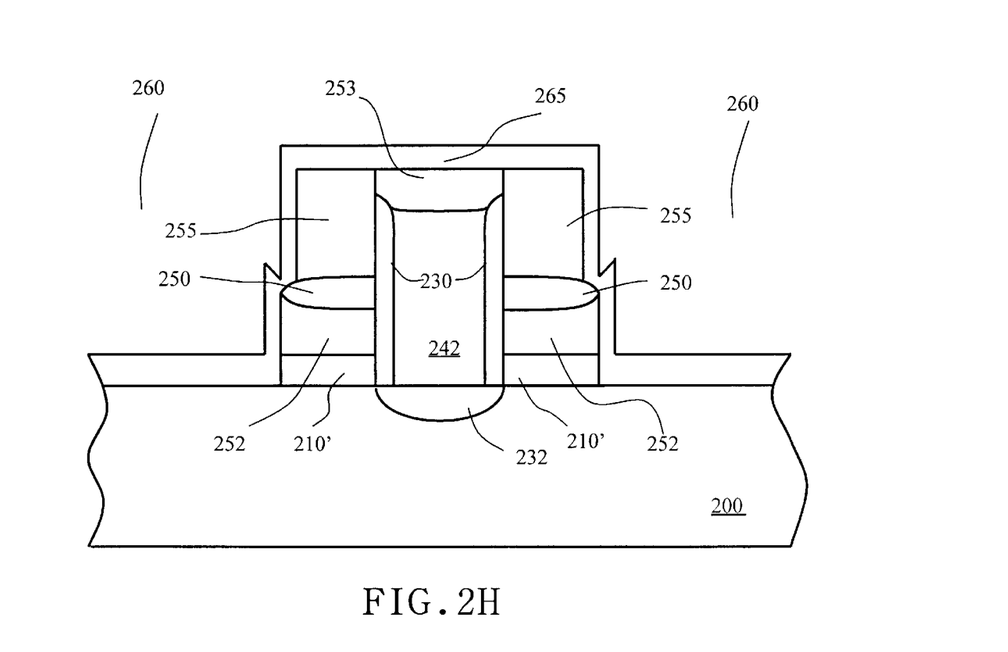

As shown in FIG. 2H, the first conductive layer 215 and the first gate insulating layer 210 are located beneath the bottom of the fourth opening 260, uncovered by the oxide layer 250, are removed by etching. The remaining first conductive layer 215 forms the floating gates 252, the remaining first gate insulating layer 210 will be referred to as the residual first gate insulating layer 210' hereafter. An insulating layer (not shown) is formed on the substrate 200, the residual first gate insulating layer 210' and the floating gates 252. The insulating layer is usually made of silicon oxide formed by oxidation and has a thickness of about 50 to 150 angstroms. Then, another insulating layer, which has a thickness of about 50 to 150 angstroms, is formed on the second buffer spacers 255, the insulating layer, the first oxide layer 250, and the second oxide layer 253. The material of the latter insulating layer is usually made of silicon oxide by CVD. The two above-mentioned insulating layers are combined as the second gate insulating layer 265 thereafter.

Figure 2I:
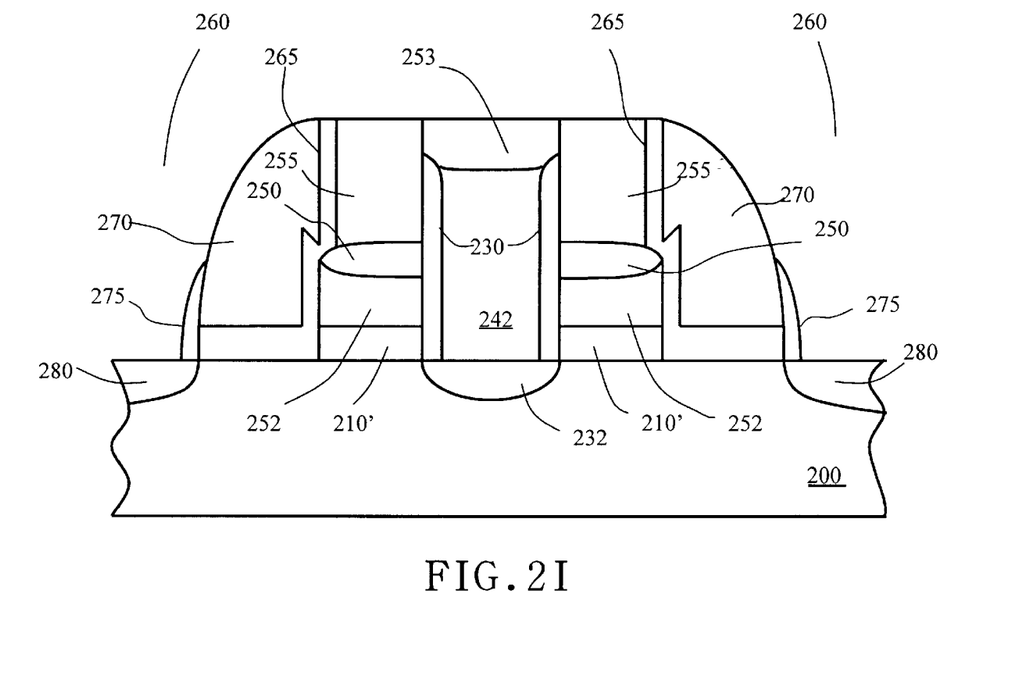

As shown in FIG. 2I, a conductive layer (not shown) is formed on the second gate insulating layer 265, the side walls and the bottom of the fourth opening 260. The conductive layer is usually made of doped polycrystalline silicon formed by LPCVD and doped with the phosphorus ions or Arsenic ions by diffusion, implantation or the in-situ doping. The thickness of the conductive layer is about 1000 to 2000 angstroms. Then, an etching is performed, in which the portion of the conductive layer, on the second buffer spacer layer 255, the second oxide 253 and the second gate insulating layer 265, are removed. Afterwards, the conductive layer remaining on the side walls of the fourth opening 260 becomes the conductive spacer, the control gates 270, and then, removing the second gate insulating layer 265 uncovered by the control gates 270. Then, an insulating layer (not shown) is formed on the control gates 270, the substrate 200 and the second gate insulating layer 265. The insulating layer can be the oxide layer formed by LPCVD process and has a thickness from 500 to 2000 angstroms. An anisotropic etching back process is performed to remove the insulating layer on the second gate insulating layer 265 and the substrate 200. Therefore, the control gate spacers 275 are formed on the side walls of the control gates 270. Finally, N-type impurity ions are implanted into the substrate 200 at the bottom of the fourth opening to form the drain regions 280.

It is to be understood that although the present invention has been described with reference to a particular preferred embodiment, it should be appreciated that numerous modifications, variations and adaptations may be made without departing from the scope of the invention as defined in the claims.

What is claimed is:

1. A method of fabricating self-aligned split gate flash memory cell, comprising:

providing a substrate;

defining an active area on said substrate;

forming a first gate insulating layer within said active area;

forming a first conductive layer on said first gate insulating layer;

forming a first buffer layer on said first conductive layer;

forming a first opening by removing a portion of said first buffer layer;

forming first buffer spacers on the side walls of said first opening;

forming a second opening by using said first buffering layer and said first buffer spacers as mask and removing a portion of said first conductive layer and said first gate insulating layer under said first opening;

forming contact spacers on the side walls of said second opening;

forming a source region by implanting impurity ions through said second opening into said substrate;

forming a contact plug in said second opening;

removing said first buffer spacers to form a third opening and expose portions of said first conductive layer;

forming a first oxide layer and a second oxide layer, wherein said first oxide layer is on the surface of said first conductive layer and at the bottom of said third opening, said second oxide layer is on the top surface of said contact plug uncovered by said contact spacers;

forming second buffer spacers in said third opening;

removing said first buffer layer to form a fourth opening;

removing said first conductive layer and said first gate insulating layer uncovered by said oxide layer at the bottom of said fourth opening to form floating gates;

forming a second gate insulating layer to cover said substrate, said residual first gate insulating layer, said floating gates, said second buffer spacers, said first oxide layer, and said second oxide layer;

forming control gates on the side walls of said fourth opening;

forming control gate spacers on the side walls of said control gates; and forming drain regions on said substrate within said fourth opening.

2. The method of claim 1, wherein said semiconductor substrate is a silicon substrate.

3. The method of claim 1, wherein said first conductive layer is made of doped polycrystalline silicon.

4. The method of claim 1, wherein said first conductive layer has a thickness from 1000 to 2000 angstroms.

5. The method of claim 1, wherein said first buffer layer is made of silicon nitride.

6. The method of claim 1, wherein said first buffer layer has a thickness from 1000 to 2000 angstroms.

7. A method of claim 1, wherein said first buffer spacers are formed by the steps comprising:

forming an insulating layer extending into said first opening to cover said first buffer layer and the side walls and bottom of said first opening; and removing portions of said insulating layer on said first buffer layer and bottom of said first opening.

8. The method of claim 7, wherein said insulating layer is made of silicon oxide.

9. The method of claim 7, wherein said insulating layer has a thickness from 500 to 2000 angstroms.

10. A method of claim 1, wherein said contact spacers are formed by the steps comprising:
   forming a first insulating layer on the surface of said first buffer layer, said first buffer spacers and the side walls and bottom of said second opening; and
   removing the portion of said insulating layer other than those on the side walls of said second opening.

11. The method of claim 10, wherein said insulating layer is made of silicon nitride.

12. The method of claim 10, wherein said insulating layer has a thickness from 100 to 300 angstroms.

13. The method of claim 1, wherein said contact plug is formed by the steps comprising:
   forming a conductive layer on said first buffer and said first buffer spacers, and filing up said second opening; and
   removing said conductive layer on both said first buffer and said first buffer spacers and leaving the portion of said second conductive layer in said second opening.

14. The method of claim 13, wherein said conductive layer is made of doped polycrystalline silicon.

15. The method of claim 13, wherein said conductive layer has a thickness of from 1000 to 3000 angstroms.

16. The method of claim 1, wherein said first oxide layer and said second oxide layer are formed by oxidation.

17. The method of claim 1, wherein said second buffer spacers are formed by the steps comprising:
   forming an insulating layer on said first buffer layer and said contact plug to fill up said third opening; and
   removing said insulating layer on said first buffer layer and said contact plug.

18. The method of claim 17, wherein said first buffer layer is made of a silicon oxide.

19. The method of claim 17, wherein said first buffer layer has a thickness of from 500 to 2000 angstroms.

20. The method of claim 1, wherein said second gate insulating layer is formed by the steps comprising:
   forming a first insulating layer on said substrate, said residual first gate insulating layer and said floating gates; and
   forming a second insulating layer on said second buffer spacers, said first insulating layer, said exposed oxide layer, said first and second insulating layers combined as said second gate insulating layer.

21. The method of claim 20, wherein said first insulating layer is made of a silicon oxide formed by oxidation.

22. The method of claim 20, wherein said first insulating layer has a thickness from 50 to 150 angstroms.

23. The method of claim 20, wherein said second insulating layer is made of silicon oxide form by CVD.

24. The method of claim 20, wherein said second insulating layer has a thickness from 50 to 150 angstroms.

25. The method of claim 1, wherein said control gates are formed by the steps comprising:
   forming a conductive layer on said second gate insulating layer to cover said side walls and bottom of said fourth opening;
   removing portions of said conductive layer and remaining the portion on the side walls of said fourth opening to form conductive spacers; and
   removing said second gate insulating layer that is exposed.

26. The method of claim 25, wherein said conductive layer is made of doped polycrystalline silicon.

27. The method of claim 25, wherein said conductive layer has a thickness from 1000 to 2000 angstroms.

28. The method of claim 1, wherein said control gate spacers are formed by the steps comprising:
   forming an insulating layer on said control gates, said substrate and said second gate insulating layer; and
   removing said insulating layer on said second gate insulating layer and said substrate.

29. The method of claim 28, wherein said insulating layer is made of a silicon oxide.

30. The method of claim 28, wherein said insulating layer has a thickness from 500 to 2000 angstroms.

* * * * *